United States Patent [19]
Shin et al.

[11] Patent Number: 5,501,995
[45] Date of Patent: Mar. 26, 1996

[54] METHOD FOR MANUFACTURING A GATE ELECTRODE OF A MOS TRANSISTOR

[75] Inventors: Hyun-koock Shin, Seoul; Kyu-charn Park, Kyungki-do; Jong Moon, Kyungki-do; Tae-earn Shim, Kyungki-do, all of Rep. of Korea

[73] Assignee: Samsung Electronics Co., Ltd., Kyungki-do, Rep. of Korea

[21] Appl. No.: 358,904

[22] Filed: Dec. 19, 1994

[30] Foreign Application Priority Data

Dec. 17, 1993 [KR] Rep. of Korea ............ 93-28223

[51] Int. Cl.⁶ ............................................ H01L 21/265
[52] U.S. Cl. ............... 437/41; 437/42; 437/183; 437/189; 437/190
[58] Field of Search ............... 437/41, 42, 43, 437/183, 185, 190, 192, 196

[56] References Cited

U.S. PATENT DOCUMENTS

| | | | |
|---|---|---|---|
| 5,158,388 | 3/1993 | Kawai | 437/192 |
| 5,183,770 | 2/1993 | Ayukawa et al. | 437/41 |
| 5,212,105 | 5/1993 | Kizu et al. | 437/41 |
| 5,213,991 | 5/1993 | Inokawa et al. | 437/41 |
| 5,284,799 | 2/1994 | Sato | 437/190 |
| 5,298,446 | 3/1994 | Onishi et al. | 437/41 |
| 5,314,834 | 5/1994 | Mazure et al. | 437/43 |
| 5,372,959 | 12/1994 | Chan | 437/41 |
| 5,429,589 | 7/1995 | Fiordalice et al. | 437/190 |

*Primary Examiner*—Brian E. Hearn
*Assistant Examiner*—Kevin M. Picardat
*Attorney, Agent, or Firm*—Robert A. Westerlund; Stephen R. Whitt; Charles R. Donohoe

[57] ABSTRACT

A method for manufacturing an electrode, e.g., a gate electrode of a MOS transistor, and an electrode and MOS transistor manufactured in accordance with this method. The method includes the steps of forming a first diffusion preventing layer on an underlying layer, forming a mask pattern having an opening on the first diffusion preventing layer, forming a metal layer on a portion of the first diffusion preventing layer exposed by the opening in the mask pattern, forming a metal layer on the exposed portion of the first diffusion preventing layer, forming a second diffusion preventing layer on the resultant structure, etching back the second diffusion preventing layer to leave a remaining portion thereof on the metal layer, removing the mask pattern, and forming a third diffusion preventing layer on exposed portions of the remaining portion of the second diffusion preventing layer, exposed sidewalls of the metal layer, and exposed portions of the first diffusion preventing layer. Preferably, the first, second, and third diffusion preventing layers are comprsied of titanium nitride, and the metal layer is comprised of copper.

12 Claims, 4 Drawing Sheets

METHOD FOR MANUFACTURING A GATE ELECTRODE OF A MOS TRANSISTOR

BACKGROUND OF THE INVENTION

The present invention relates generally to semiconductor devices, and, more particularly, to a semiconductor device having a novel electrode structure and a method for manufacturing the same.

Generally, the gate electrode of a metal oxide semiconductor (MOS) transistor is made of polysilicon doped with impurities. Such a polysilicon gate electrode provides a significant advantage over competing alternatives, such as metal gate electrodes. Namely, the process for manufacturing polysilicon gate electrodes can be more stably and tightly controlled than the process for manufacturing metal gate electrodes. However, polysilicon gate electrodes have a significant disadvantage, namely, the sheet resistance thereof is higher than that of metal gate electrodes. More particularly, the sheet resistance of polysilicon gate electrodes is nearly 1,000 $\mu\Omega$/, which results in decreased signal transmission speed and increased power consumption of the MOS transistor and associated semiconductor device. These disadvantages of polysilicon gate electrodes have become a more important factor as the level of integration (i.e., integration density) of semiconductor devices has increased. Thus, such drawbacks and shortcomings of polysilicon gate electrodes have imposed limitations on device capacity and reliability.

On the other hand, while metal gate electrodes exhibit significantly lower sheet resistance than polysilicon gate electrodes, they present other problems. Most importantly, during the fabrication of a semiconductor device, process steps which are performed subsequent to the formation of the metal gate electrode cause the metal to diffuse into and/or precipitate onto underlying layers of the device, thereby greatly degrading or destoying the operational characteristics of the device.

Based on the above, it can be appreciated that there presently exists a need in the semiconductor art for a semiconductor device having a gate electrode structure, which overcomes the above-described drawbacks and shortcomings of presently available gate electrode structures. The present invention fulfills this need.

SUMMARY OF THE INVENTION

In a preferred embodiment, the present invention encompasses a method for manufacturing an electrode, e.g., a gate electrode of a MOS transistor, and an electrode and MOS transistor manufactured in accordance with this method. The method includes the steps of forming a first diffusion preventing layer on an underlying layer, forming a mask pattern having an opening on the first diffusion preventing layer, forming a metal layer on a portion of the first diffusion preventing layer exposed by the opening in the mask pattern, forming a metal layer on the exposed portion of the first diffusion preventing layer, forming a second diffusion preventing layer on the resultant structure, etching back the second diffusion preventing layer to leave a remaining portion thereof on the metal layer, removing the mask pattern, and forming a third diffusion preventing layer on exposed portions of the remaining portion of the second diffusion preventing layer, exposed sidewalls of the metal layer, and exposed portions of the first diffusion preventing layer. Preferably, the first, second, and third diffusion preventing layers are comprsied of titanium nitride, and the metal layer is comprised of copper.

BRIEF DESCRIPTION OF THE DRAWINGS

These and various other features and advantages of the present invention will be readily understood with reference to the following detailed description read in conjunction with the accompanying drawings, in which.

DETAILED DESCRIPTION OF THE INVENTION

Figure 1:
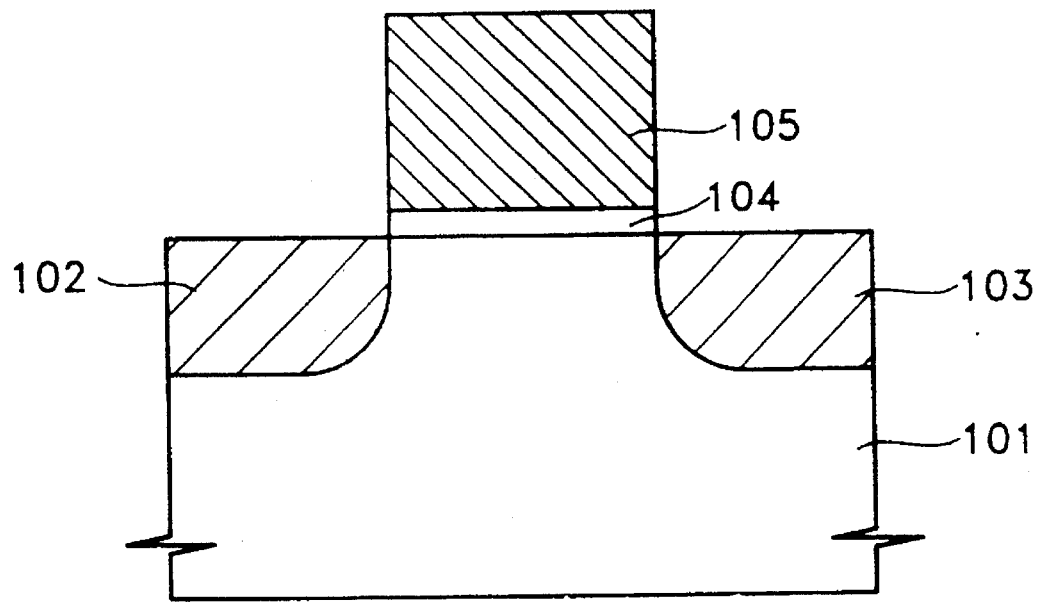
FIG. 1 is a partial, cross-sectional view of a conventional MOS transistor.

With reference now to FIG. 1, there can be seen a conventional MOS transistor, which includes a source region 102 and a drain region 103 formed in a semiconductor substrate 101. The spacing between the source region 102 and the drain region 103 define the channel of the transistor. The gate electrode of the transistor includes a gate insulating layer 104 formed on the surface of the semiconductor substrate 101 above the channel of the transistor, and a doped polysilicon layer 105 formed on the gate insulating layer 104.

Figure 2:
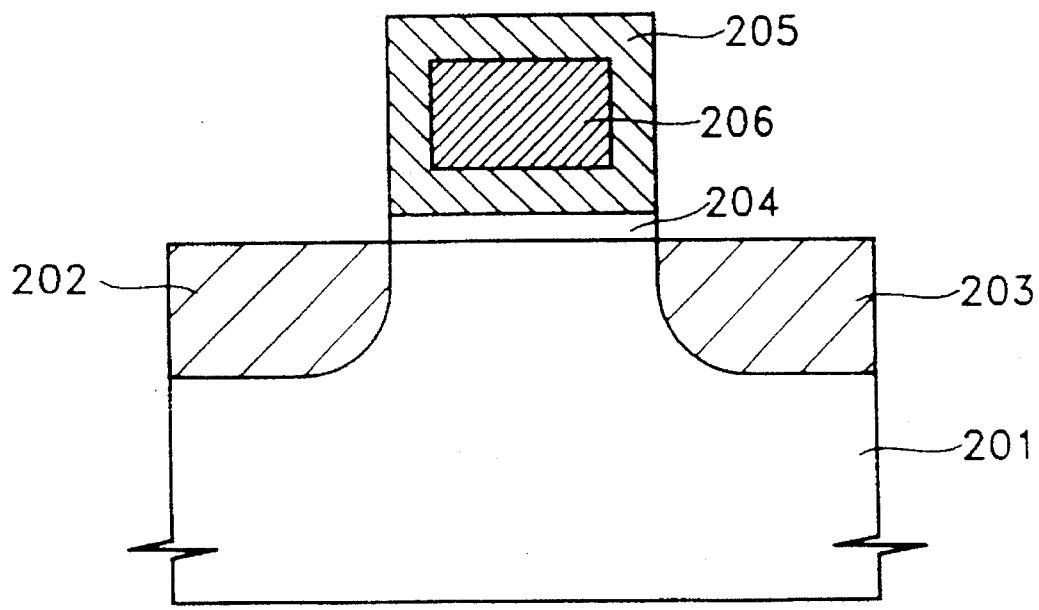
FIG. 2 is a partial, cross-sectional view of a MOS transistor constructed in accordance with a first preferred embodiment of the present invention.

With reference now to FIG. 2, there can be seen a MOS transistor constructed in accordance with a first preferred embodiment of the present invention, which includes a source region 202 and a drain region 203 formed in a semiconductor substrate 201. The spacing between the source region 202 and the drain region 203 defines the channel of the transistor. In accordance with the present invention, the transistor includes a novel gate electrode which includes a gate insulating layer 204 formed on the semiconductor substrate above the channel of the transistor, and a metal layer 206 encapsulated by a diffusion preventing layer 205 made of a diffusion preventing material. The metal layer 206 is preferably made of copper, which has a sheet resistance of 1.673 $\mu\Omega$/, and the diffusion preventing layer 205 is preferably made of titanium nitride, although this is not limiting to the broader aspects of the present invention. The diffusion preventing layer 205 serves to prevent diffusion of metal from the metal layer 206 into the gate insulating layer 204 and from precipitating onto the semiconductor substrate 201.

The source and drain regions 202, 203, respectively, of the MOS transistor depicted in FIG. 2 are preferably formed by an ion-injection process after the gate electrode comprised of the layers 204, 205, and 206 is formed.

Figure 3:
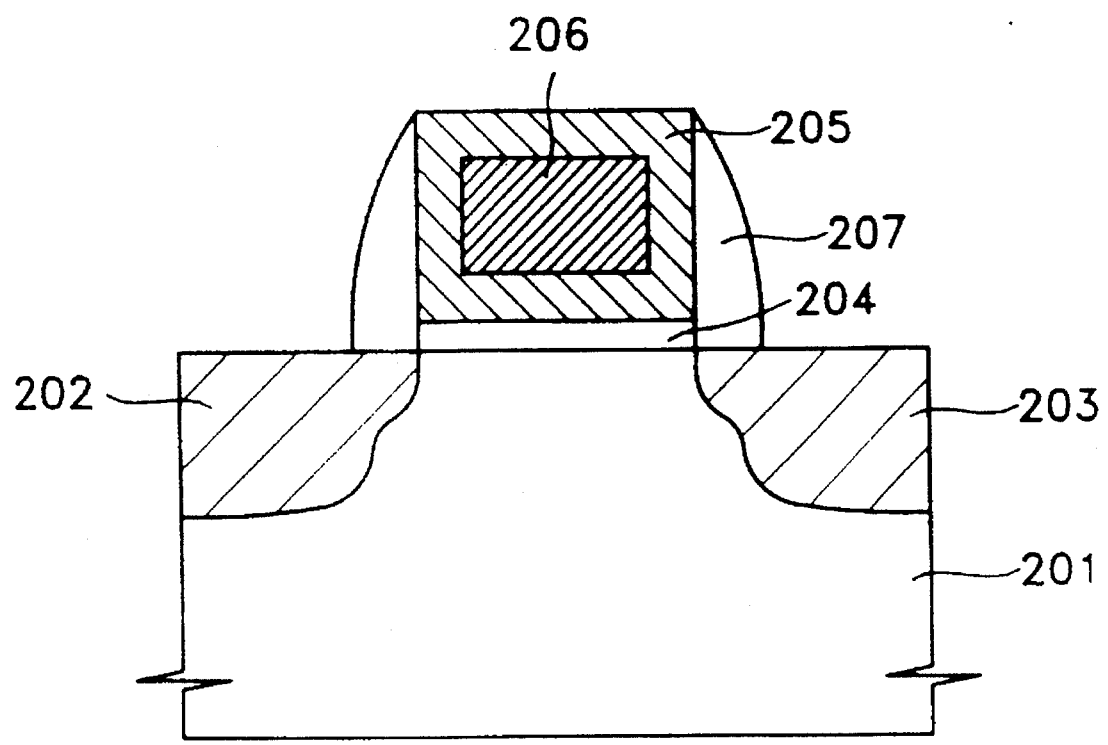
FIG. 3 is a partial, cross-sectional view of a MOS transistor constructed in accordance with a second preferred embodiment of the present invention; and, FIGS. 4A–4E are cross-sectional views depicting successive steps of a process for manufacturing the novel gate electrode of the MOS transistor of the present invention.

With reference now to FIG. 3, there can be seen a MOS transistor constructed in accordance with a second preferred embodiment of the present invention, which differs from the MOS transistor of the first preferred embodiment in only the following respects. Namely, the MOS transistor of the second preferred embodiment further includes a spacer 207 formed on the sidewalls of the gate electrode, and, additionally, the source and drain regions 202, 203, respectively, have a lightly doped drain (LDD) structure.

The source and drain regions 202, 203, respectively, of the MOS transistor depicted in FIG. 3 are preferably formed by an ion-injection process after the gate electrode comprised of the layers 204, 205, and 206 is formed, using the gate electrode and the spacer 207 as a mask.

With reference now to FIGS. 4A–4E, successive steps of a method for manufacturing the above-described novel gate electrode in accordance with the present invention are depicted.

Figure 4A:
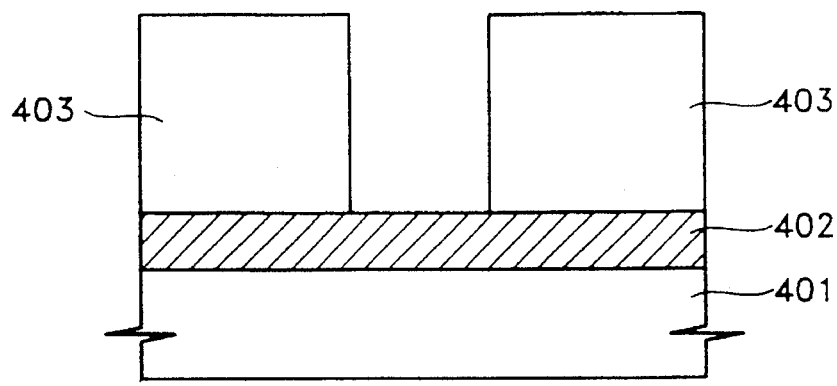

More particularly, with specific reference now to FIG. 4A, a thin first diffusion preventing layer 402 is deposited on an underlying layer 401. Preferably, the first diffusion preventing layer 402 is formed of titanium nitride vapor-deposited by means of a sputtering method to a thickness of approximately 300 angstroms, although this is not limiting to the broader aspects of the present invention. The underlying layer 401 may be a semiconductor substrate, a gate insulating layer formed on a semiconductor substrate, or any other suitable structure for a MOS transistor.

Next, a mask pattern 403 having an opening or window formed therein is formed on the first diffusion preventing layer 402. The opening in the mask pattern 402 exposes a selected portion of the titanium nitride layer 402. For example, a photoresist layer (not shown in its entirety) is formed on the first diffusion preventing layer 402, e.g., to a thickness of approximately 3,000 angstroms, and a selected portion of the photoresist layer is selectively exposed, using a suitable photomask (not shown), and then developed and removed, to thereby form the opening, which is generally located above the site of the channel region of the completed MOS transistor.

Figure 4B:
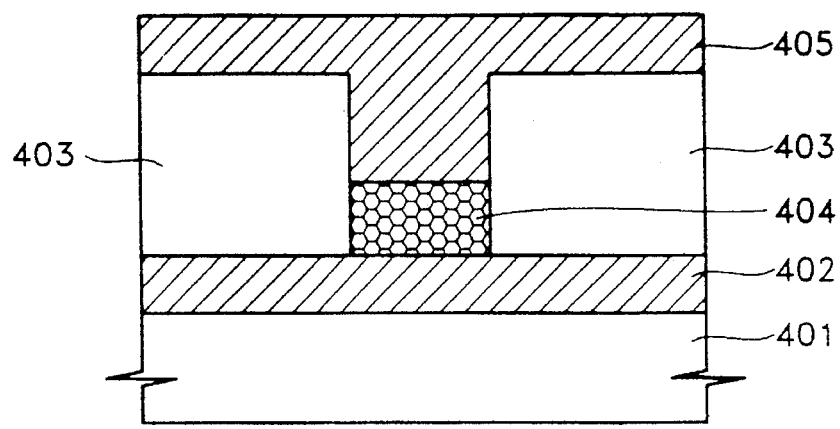

Next, with specific reference now to FIG. 4B, a thin metal layer 4, preferably made of copper and having a thickness of approximately 1,000 angstroms, is selectively vapor-deposited on the exposed portion of the first diffusion preventing layer 402, preferably by means of a MOVCD process carried out at a temperature of approximately 120°–250° C. The mask pattern 403 serves as a crystal growth prevention mask.

Next, a second diffusion preventing layer 405 is formed on the resultant structure, i.e., on exposed surfaces of the mask pattern 403 and metal layer 404. The second diffusion preventing layer 405 is preferably formed of titanium nitride deposited by a blanket MOCVD process, to thereby minimize step formation, although this is not limiting to the broader aspects of the present invention.

Figure 4C:
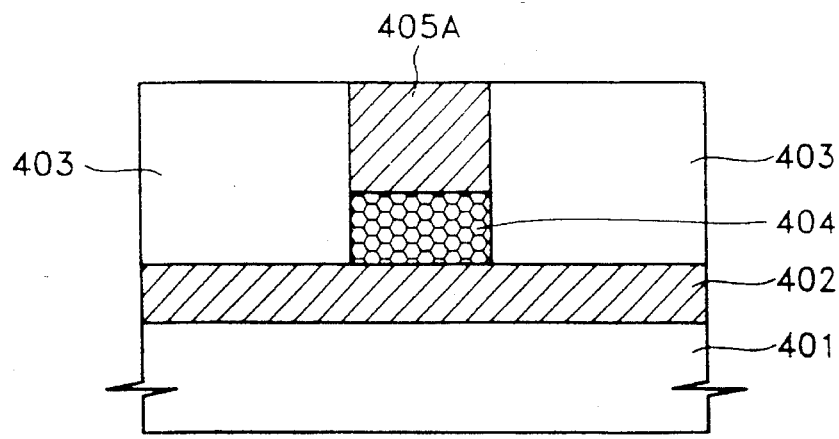

Next, with specific reference now to FIG. 4C, the second diffusion preventing layer 405 is etched back to expose the mask pattern 403, with only the portion 405A of the second diffusion preventing layer 405 on the metal layer 404 being left.

Figure 4D:
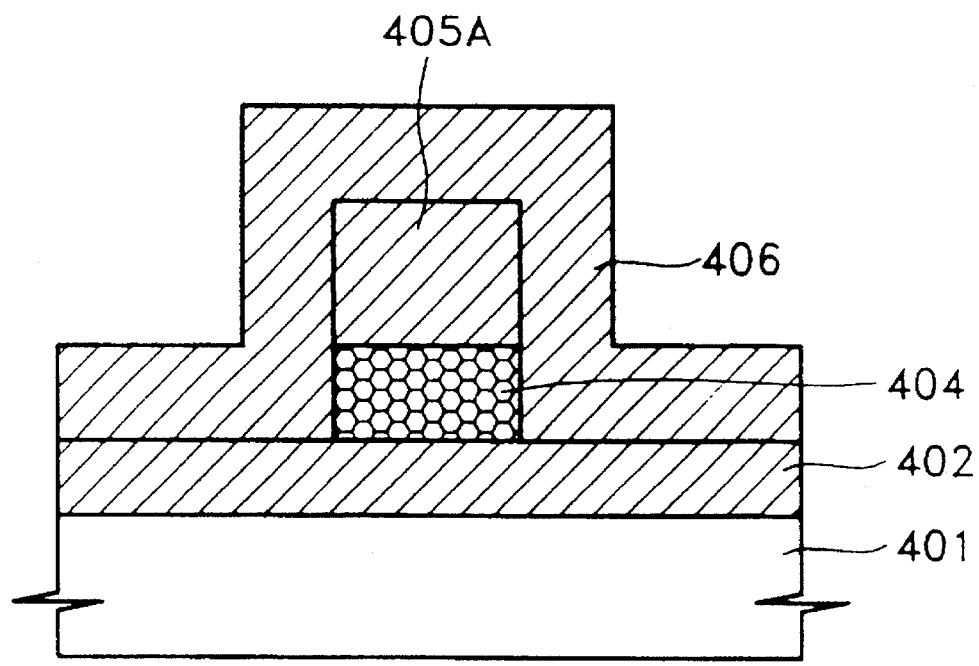
Figure 4E:
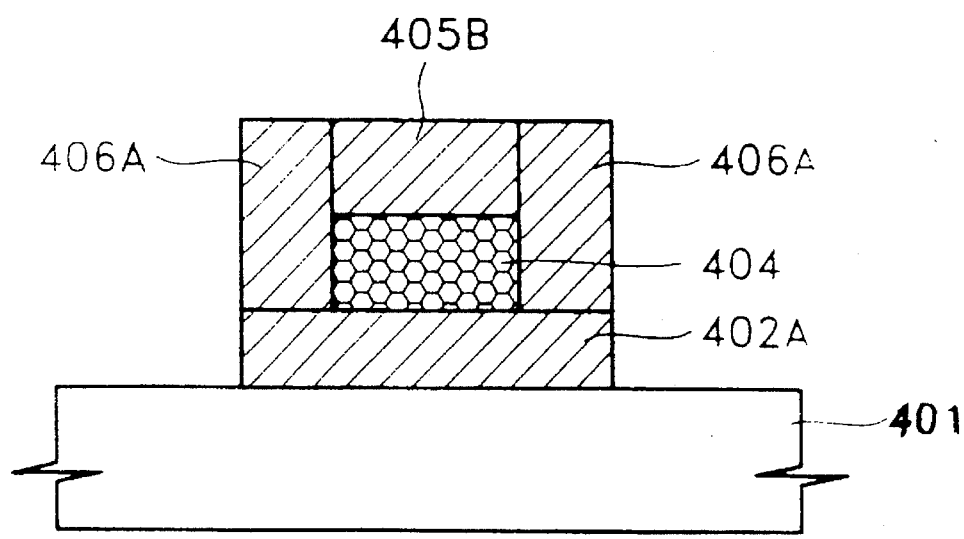

Next, with specific reference now to FIG. 4D, the mask pattern 403 is removed, thereby exposing the sidewalls, (but only the sidewalls), of the metal layer 404. In order to cover the exposed or unprotected sidewalls of the metal layer 404 with a diffusion preventing material, a third diffusion preventing layer 406 is formed on the resultant structure, i.e., on the exposed surfaces of the first diffusion preventing layer 402, the remaining portion 405A of the second diffusion preventing layer, and the sidewalls of the metal layer 404. The third diffusion preventing layer is preferably formed of titanium nitride vapor-deposited to a thickness of approximately 1,000 angstroms by means of a chemical vapor deposition (CVD) process, e.g., an MOCVD process.

As a result of the preceding steps, the metal layer 404 is completely encapsulated by a diffusion preventing material, e.g., titanium nitride. Thereafter, with specific reference now to FIG. 4E, the first and third diffusion preventing layers 402, and 406 are etched back, thereby leaving only the portion 406A covering the sidewalls of the metal layer 404 and the remaining portion 405A of the second diffusion preventing layer, and the portion 402A of the first diffusion layer which does not extend beyond the sidewalls of the remaining portion 406A of the third diffusion preventing layer. If a dry etching method is employed, due to the different lateral and vertical etching rates, the remaining portion 405A of the second diffusion preventing layer be partially etched back, thereby leaving a lesser portion 405B of the second diffusion preventing layer.

Although presently preferred embodiments of the method and device of the present invention have been described in detail hereinabove, it should be clearly understood that many variations and/or modifications thereof which may appear to those skilled in the art will still fall within the spirit and scope of the present invention as defined in the appended claims.

What is claimed is:

1. A method for manufacturing an electrode, comprising the steps of:

forming a first diffusion preventing layer on an underlying layer;

forming a mask pattern having an opening on said first diffusion preventing layer, said opening exposing a portion of said first diffusion preventing layer;

forming a metal layer on said exposed portion of said first diffusion preventing layer;

forming a second diffusion preventing layer on exposed portions of said metal layer and said mask pattern;

etching back said second diffusion preventing layer in such a manner as to expose a first major surface of said mask pattern, and to leave a remaining portion of said second diffusion preventing layer on said metal layer;

removing said mask pattern; and, forming a third diffusion preventing layer on exposed portions of said remaining portion of said second diffusion preventing layer, exposed sidewalls of said metal layer, and exposed portions of said first diffusion preventing layer.

2. The method as set forth in claim 1, further comprising the step of selectively etching back at least said first and third diffusion preventing layers in such a manner as to leave corresponding remaining portions of said first and third diffusion preventing layers, to thereby complete an electrode structure comprised of said metal layer encapsulated by said remaining portions of said first, second, and third diffusion preventing layers.

3. The method as set forth in claim 1, wherein said first, second, and third diffusion preventing layers include titanium nitride.

4. The method as set forth in claim 3, wherein said metal layer includes copper.

5. The method as set forth in claim 2, wherein said underlying layer comprises an insulating layer.

6. The method as set forth in claim 1, wherein said underlying layer comprises a semiconductor substrate.

7. The method as set forth in claim 5, wherein said insulating layer is formed on a semiconductor substrate above a channel region of a MOS transistor formed therein, whereby said electrode comprises a gate electrode of said MOS transistor.

8. The method as set forth in claim 7, further comprising the steps of ion implanting impurities in said semiconductor substrate to form source and drain regions of said MOS transistor in said semiconductor substrate.

9. The method as set forth in claim 7, further comprising the steps of:

forming a spacer on sidewalls of said electrode structure; and, ion implanting impurities in said semiconductor substrate to form source and drain regions of said MOS transistor in said semiconductor substrate, using said electrode structure and said spacer as an ion implantation mask.

10. The method as set forth in claim 7, wherein said steps for forming said first, second, and third diffusion preventing layers are carried out by means of a vapor deposition process.

11. The method as set forth in claim 10, wherein said step of forming said metal layer is carried out by means of a vapor deposition process.

12. The method as set forth in claim 11, wherein said vapor deposition process for forming said metal layer comprises an MOCVD process.

* * * * *